United States Patent [19]
Lucas et al.

[11] Patent Number: 5,827,625
[45] Date of Patent: Oct. 27, 1998

[54] METHODS OF DESIGNING A RETICLE AND FORMING A SEMICONDUCTOR DEVICE THEREWITH

[75] Inventors: Kevin Lucas; Michael E. Kling; Bernard J. Roman; Alfred J. Reich, all of Austin, Tex.

[73] Assignee: Motorola, Inc., Schaumburg, Ill.

[21] Appl. No.: 912,601

[22] Filed: Aug. 18, 1997

[51] Int. Cl.⁶ .................................................. G03F 9/00
[52] U.S. Cl. ........................................................ 430/5
[58] Field of Search .............................. 430/5, 322, 324, 430/311

[56] References Cited

U.S. PATENT DOCUMENTS

| | | | |
|---|---|---|---|
| 4,231,811 | 11/1980 | Somekh et al. | 148/1.5 |
| 5,242,770 | 9/1993 | Chen et al. | 430/5 |
| 5,286,581 | 2/1994 | Lee | 430/5 |
| 5,302,477 | 4/1994 | Dao et al. | 430/5 |
| 5,718,829 | 2/1998 | Pierrat | 216/12 |

OTHER PUBLICATIONS

Kenny, et al., "Chromeless Phase–Shifted Masks: A New Approach to Phase–Shifting Masks", A Preprint from the Tenth Annual Symposium on Microlithography of BACUS, pp. 1–12, Figs. 1–15, Sep. (1990).

Kim, et al. "CD Control for 180–nm and 130–nm Gate–Level Lithography", Microlithography World, pp. 16–21 (Autumn 1996).

Garofalo, et al., "Lithography Tricks and Tribulations", SPIE, vol. 2884, pp. 311–322, Jul. (1996).

*Primary Examiner*—S. Rosasco
*Attorney, Agent, or Firm*—George R. Meyer; Sandra L. Godsey

[57] ABSTRACT

A process for designing and forming a reticle (40) as well as the manufacture of a semiconductor substrate (50) using that reticle (40). The present invention places outriggers (32, 34, 36) between features (30) in both dense and semi-dense feature patterns to assist in the patterning of device features. The width of the outriggers can be changed based on pitch and location between features in a semi-dense or dense feature pattern. In one embodiment, the outriggers can be manually or automatically inserted into the layout file after the locations of the attenuating features have been determined. The outriggers are not patterned on the substrate, but assist in forming resist features of uniform width.

34 Claims, 4 Drawing Sheets

METHODS OF DESIGNING A RETICLE AND FORMING A SEMICONDUCTOR DEVICE THEREWITH

FIELD OF THE INVENTION

This invention relates in general to reticles and semiconductor devices, and more particularly, to methods of designing and forming reticles and forming semiconductor devices using the reticles, where the reticles include resolution assisting features.

BACKGROUND OF THE INVENTION

Semiconductor devices are requiring smaller and smaller dimensions in forming future generations of products. One problem in the prior art has been the patterning differences between dense, semi-dense, and isolated feature patterns. A reticle having uniform widths of all features on that reticle produces different widths after a resist layer is exposed using that reticle and developed. Referring to FIG. 1, the resist layer has dense features each having a width of $W_D$, semi-dense features each having a width of $W_S$, and the isolated features having a width of $W_I$. As seen in FIG. 1, the width of the dense feature is narrower than the width of the semi-dense feature, which is narrower than the width of the isolated feature. FIG. 1 illustrates a resist profile of each of the above mentioned features. It is desirable for the resist profile to have a square shape and not a rounded shape.

An attempt to solve the prior art problems has been to use outriggers as illustrated in FIG. 2. FIG. 2 includes a portion of a reticle that has attenuating features 20, which are of relatively uniform width, and outriggers 22. Outriggers 22 are reticle features that do not print into an underlying resist layer. This should be compared with the features 20 which can be printed into the resist layer. As seen in FIG. 2, the outriggers 22 lie adjacent to only the edges of the feature patterns. More specifically, in the case of the dense and semi-dense feature patterns, the outriggers only lie outside the outermost features 20 and do not lie between the features 20 within each of the feature patterns. Note that the outriggers 22 are of substantially the same width.

The use of outriggers as shown in FIG. 2 helps to improve resolution of features 20 closest to the outriggers 22 but does not completely correct for the width differences. The resolution improvement results in a square resist profile. However, the resolution improvement does not result in uniform widths among features 20. The resultant widths of semi-dense, dense, and isolated features are not the same. The differences in the widths of the various features produced by the prior art methods prevents optimization of illumination and introduces biasing. There is a need for a method of forming features having the desired resist profile and uniform width.

BRIEF DESCRIPTION OF THE DRAWINGS

The present invention is illustrated by way of example and not limitation in the accompanying figures, in which like references indicate similar elements, and in which.

Skilled artisans appreciate that elements in the FIGS. are illustrated for simplicity and clarity and have not necessarily been drawn to scale. For example, the dimensions of some of the elements in the figures may be exaggerated relative to other elements to help to improve understanding of embodiment(s) of the present invention.

DETAILED DESCRIPTION

A method of designing and forming a reticle and method of forming a semiconductor substrate using that reticle is discussed in more detail below. An aspect of the present invention includes the use of outriggers between features in both dense and semi-dense feature patterns. Additionally, the width of the outriggers can be varied based on pitch-to-line-width ratio for a given feature pattern. The present invention will be better understood with the detailed description of the embodiments that follow.

Before beginning the description of the present invention, some terms need to be defined or explained to clarify understanding. Attenuating features are reticle features that correspond to resist features to be formed within a resist layer. In the case of positive photoresist, the attenuating features: (i) are opaque to the radiation used by the lithography tool (i.e., chrome, etc.) or (ii) include portions that allow radiation to pass through the reticle, however, the radiation from the portions destructively interfere with each other before reaching the resist layer (i.e., phase shifting regions). In the case of negative photoresist, attenuating features are portions of the reticle that allow radiation to reach the resist layer. Therefore, attenuating features correspond to resist features that are to remain after the resist layer is exposed and developed. The resist features correspond to device features to be formed within or over a semiconductor device substrate.

As used herein, the resolution limit refers to the resolution limit of the lithography tool used to expose the resist layer. Subresolution is below that resolution limit. Outriggers are "subresolution" reticle features because the corresponding image, when projected onto the resist layer, is below the resolution limit and does not substantially pattern the underlying resist layer. For example, a lithography tool has a 4× projection system and a resolution limit of 0.2 microns. An outrigger with a width of 0.60 microns is a subresolution reticle feature because the projected image would be 0.15 microns and is below the resolution limit of 0.2 microns.

Figure 1:
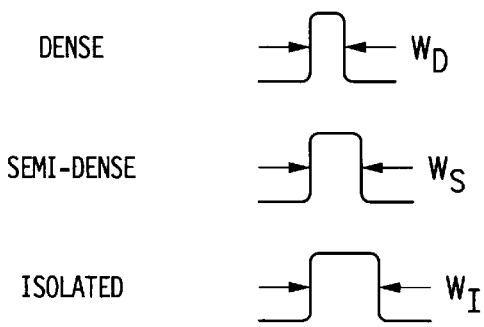
FIG. 1 includes an illustration of resist profiles for dense, semi-dense, and isolated features (prior art)
Figure 2:
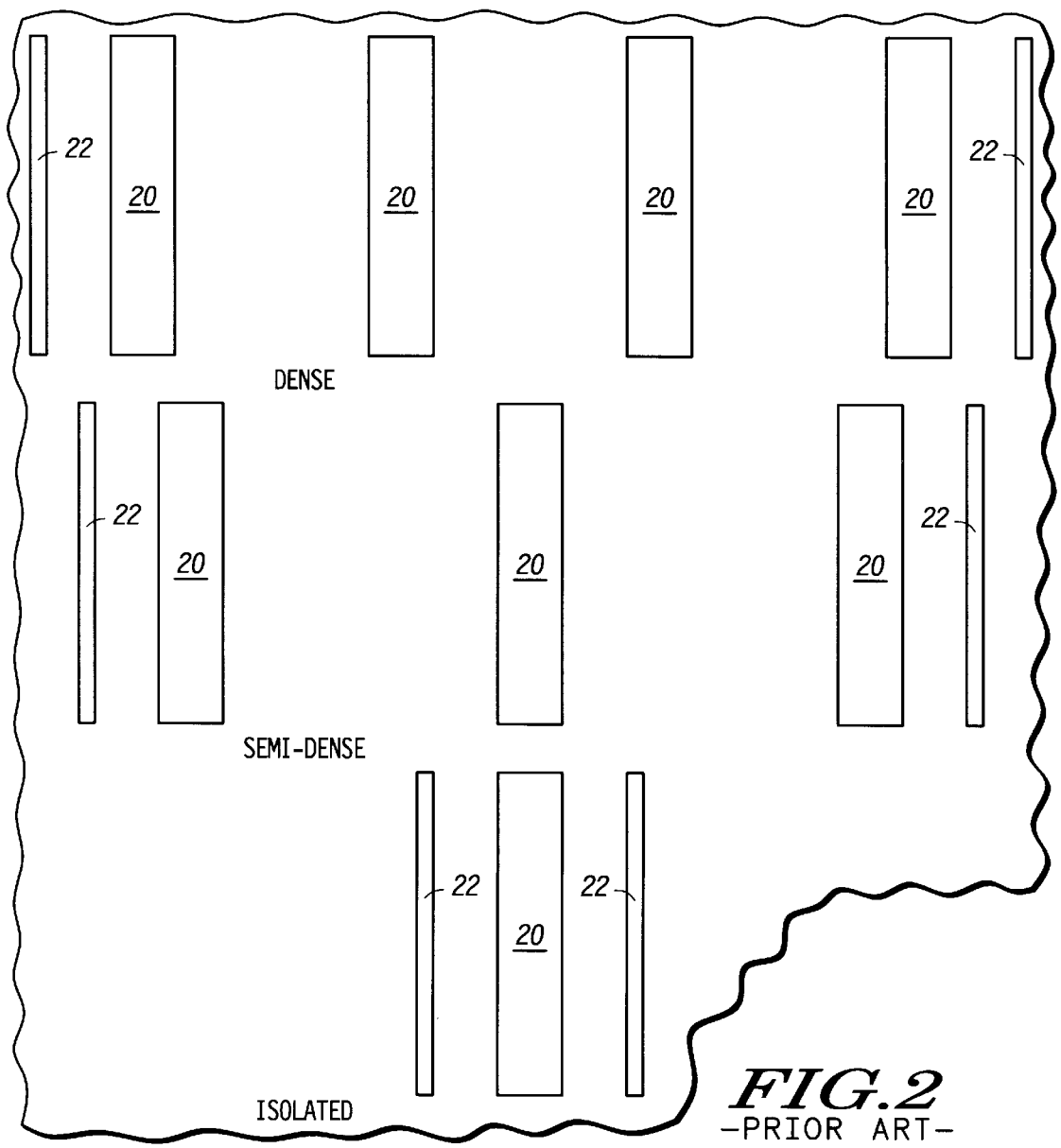
FIG. 2 includes a top view of a portion of a reticle including features and outriggers (prior art)
Figure 3:
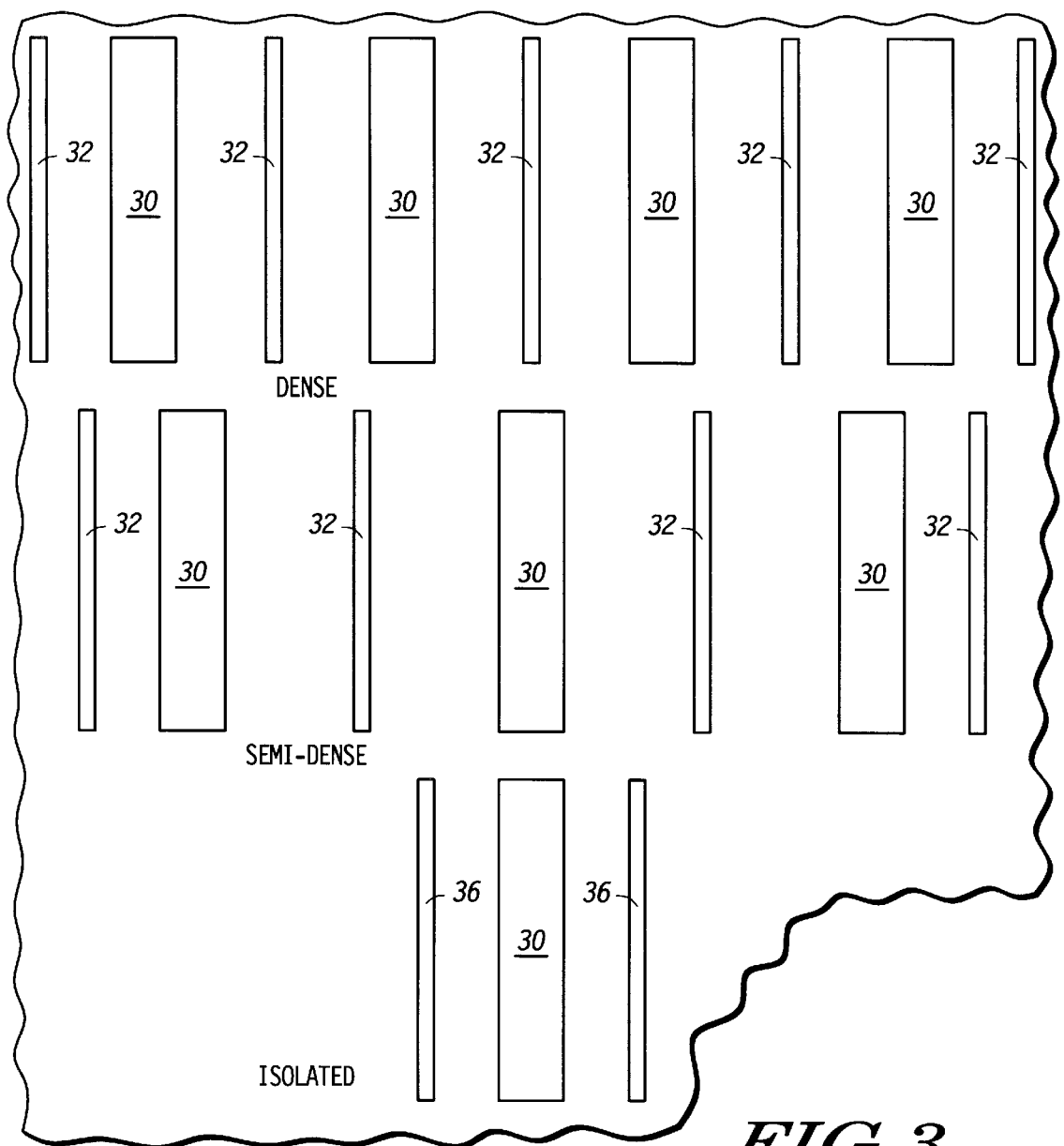
FIG. 3 includes an illustration of a top view of a portion of a reticle that includes features and outriggers in accordance with an embodiment of the present invention.

FIG. 3 includes a top view of a reticle that illustrates the use of outriggers for dense, semi-dense and isolated feature patterns. Attenuating features 30, as illustrated in FIG. 3, are of a substantially uniform width. However, in alternative embodiments these widths can vary. The outriggers 32, 34, and 36 are illustrated as having different line widths based on where the outriggers are located. Also, the three patterns have different pitches. Pitch is the distance that is the sum of a line width of an attenuating feature 30 and the distance between that feature 30 and the next adjacent feature 30. The three different feature patterns have different pitch-to-line width ratios. The dense feature pattern has a pitch-to-line width ratio no greater than approximately 3:1, the isolated feature pattern has a pitch-to-line width ratio of at least 6:1, and the semi-dense feature pattern has a pitch-to-line width ratio between 3:1 and 6:1.

As illustrated in FIG. 3, the dense feature pattern has outriggers 32 that are relatively narrow because the pitchto-line width ratio is relatively small compared to the semi-dense and isolated feature patterns. In the semi-dense feature patterns, the outriggers 32 are on both sides of the pattern. However, in between the features 30 are outriggers 34 that are slightly wider to account for the larger pitch-to-line-width ratio in the semi-dense lines. Illustrated in the isolated feature pattern are outriggers 36 that can be the same width or wider than the outriggers 32 or 34.

The dense and semi-dense feature patterns have only one outrigger between each of the features 30. Compare this with the prior art, in which there are no outriggers between features within the dense or semi-dense feature patterns. For isolated feature patterns, each isolated feature has two outriggers 36 adjacent to each of its opposing edges. Another portion of the device that would have an isolated feature may be 10 microns or more away from the isolated line and would similarly have a pair of outriggers 36 surrounding a different feature 30, but is not illustrated in FIG. 3. Therefore, as in the prior art for the isolated feature patterns, there could be two outriggers 36 that would lie between the widely spaced apart features 30.

Although this embodiment will be discussed in some detail, the present invention can be used for a wide variety of wavelengths of radiation sources, numerical aperture of lenses, and resist materials used in forming semiconductor devices. Examples of wavelengths used can range from approximately 436 nanometers (g-line) and lower. Other commonly used wavelengths include approximately 356 nanometers (i-line), approximately 248 nanometers (deep ultraviolet or DUV), and approximately 193 nanometers (extreme ultraviolet or EUV). The numerical aperture of the lenses are generally in a range of approximately 0.45 to 0.65. The resist materials typically are determined by the radiation source used, as the materials within the resist must be activated optimally at the wavelength of the radiation source used. Other resist materials, light source configurations, numerical apertures, and wavelengths can be used. The present invention could be used for longer wavelength systems to extend their useful life before having to replace the equipment.

The present invention can be used during the design and formation of a reticle. During design, a semiconductor device layout file is generated. The portions of the layout file corresponding to the attenuating features 30 are made. The outriggers can be manually or automatically inserted into the layout file after the locations of the attenuating features have been determined. As previously mentioned, the outriggers can be scaled to the pitch-to-line-width ratio. The dense feature pattern may be seen with a memory array, and the semi-dense and isolated feature patterns may be used with logic portions of a semiconductor device.

After the layout file is completed, the layout file can be transferred to a reticle fabrication tool, such as an electron beam writer. Typically, the layout file is downloaded into a computer coupled to the reticle fabrication tool. A reticle substrate is processed to form a reticle having the pattern shown in FIG. 3.

Figure 4:
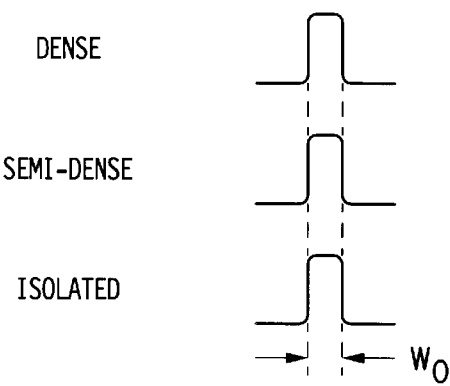
FIG. 4 includes an illustration of resist profiles for dense, semi-dense and isolated features using a reticle similar to the one shown in FIG. 3.

The reticle as illustrated in FIG. 3 can be used to form a semiconductor device by exposing and developing a resist layer to give features similar to those shown in FIG. 4. FIG. 4 includes an illustration of resist profiles. As can be seen, the width of the dense, semi-dense, and isolated features are substantially the same.

Figure 5:
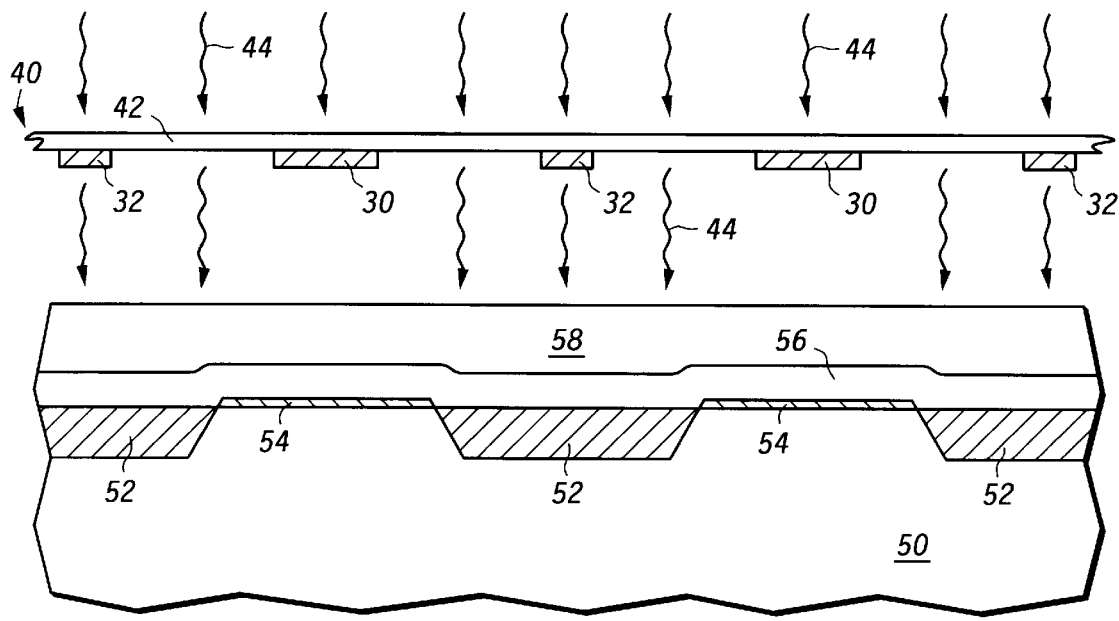
FIGS. 5–8 include illustrations of cross-sectional views of a portion of a substrate in accordance with the present invention.

A semiconductor device is formed as illustrated in FIGS. 5–8. In FIG. 5, a semiconductor device substrate 50 includes field isolation regions 52, a gate dielectric layer 54, a conductive layer 56 and a resist layer 58. The semiconductor device substrate 50 can be a monocrystalline semiconductor wafer, a semiconductor-on-insulating wafer, or any other substrate used to form semiconductor devices. Field isolation regions 52, the gate dielectric layer 54 and conductive layer 56 are all formed using conventional processing steps. The conductive layer 56 includes polysilicon, amorphous silicon, a silicide, or other metal-containing material. The resist layer 58 is typically coated over the wafer and is spun on to achieve a relatively planar upper surface.

Reticle 40 includes a transparent substrate 42 made of quartz, glass, or the like and has attenuating features 30 and outriggers 32. The reticle 40 is placed between the substrate 50 and the radiation source of a lithography tool (not illustrated) in FIG. 5 to emanate radiation 44 as illustrated in FIG. 5. The radiation 44 does not pass through the features 30. The radiation 44 is able to bend around the outriggers 32 to expose portions of the resist layer 58 beneath the transparent portions of the reticle 40 and underneath the outriggers 32. The features 30 substantially block the radiation 44 from reaching the resist layer 58 below those features.

Figure 6:
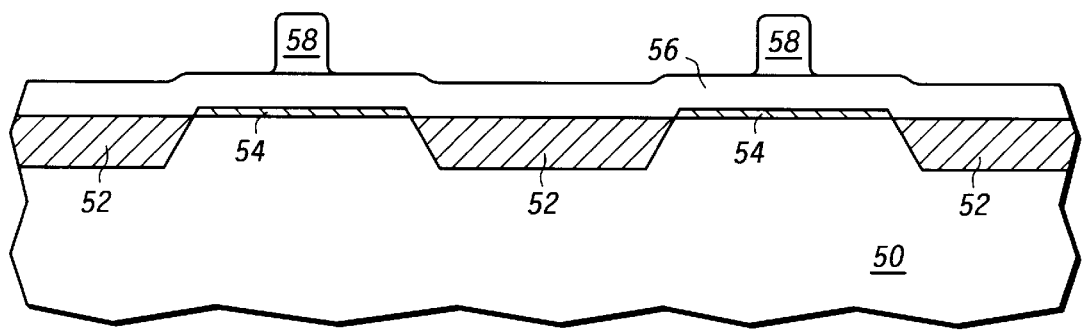
Figure 7:
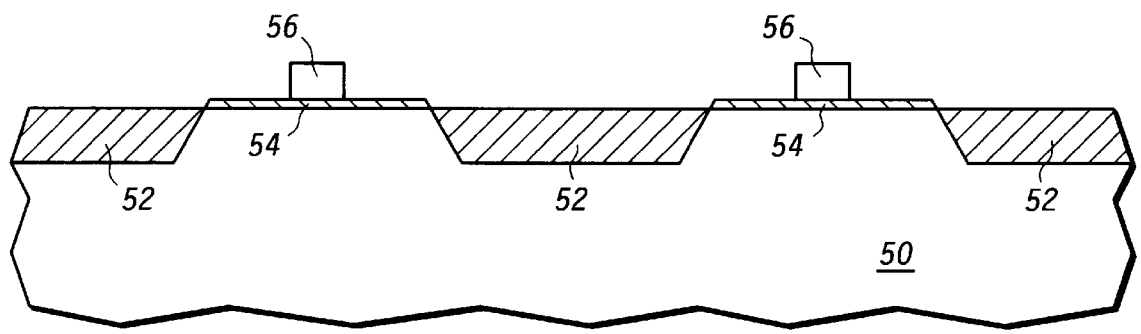

The substrate is then removed from the lithography tool and the resist layer 58 is then developed using a conventional method. After developing, the resist layer 58 has members that overlie conductive layer 56 where gate electrodes will be formed as shown in FIG. 6. The substrate is then etched using a conventional etching step to form gate electrodes from the conductive layer 56. After etching to form the gate electrodes the resist members 58 are then removed using a conventional process. FIG. 7 includes an illustration of the device at this point in the process.

Figure 8:
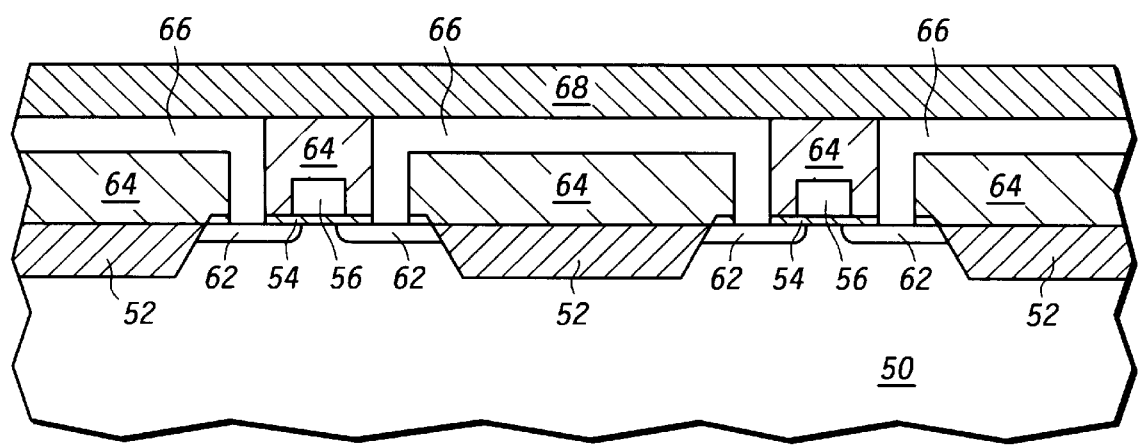

Processing continues to form a substantially completed semiconductor device as illustrated in FIG. 8. After the gate electrodes have been formed, doped regions 62 are formed in the substrate 50, and an interlevel dielectric layer 64 is then formed by deposition over the gate electrodes formed in conductive layer 56, doped regions 62 and field isolation regions 52. The interlevel dielectric layer 64 may include doped oxide, undoped oxide, or a combination thereof. The interlevel dielectric layer 64 is then patterned and interconnects 66 are formed to the doped regions 62. Other openings are made to the conductive layer 56 to connect the gate electrodes to other portions of the device but are not illustrated in FIG. 8. After forming the interconnects 66, a passivation layer 68 is then formed over the interconnects 66. In alternate embodiments, other contacts, interlevel dielectric layers, and interconnects may be formed as needed. The passivation layer 68 overlies the uppermost interconnect level.

The embodiments of the present invention include a number of benefits. First, the outriggers can be used at any pitch-to-line width ratio. Further, all features more closely replicate the dense feature pattern. Therefore, there is not a combination of characteristics that are unique to the dense, semi-dense and isolated feature patterns. In other words, the illumination conditions can be optimized for a dense feature pattern since there will always be outriggers adjacent to each of the features. For example, annular illumination can be effectively used to improve processing latitude. A further benefit of the present invention is that it can be used to extend the lifetime of existing equipment. More specifically, g-line steppers may be able to achieve a minimum lithography of approximately 0.8 microns. By the use of the outriggers, the minimum geometry may be extended down to 0.7 microns or possibly even lower. A further benefit of the present invention is that it can be used over a widely varying set of lithography parameters including wavelength and numerical aperture of the lens.

Another important feature of the present invention is that embodiments do not require the use of complicated or marginal processing steps. The reticle should be used in a manner that would be relatively transparent to process engineers and operators working within a wafer fabrication facility.

The embodiments of the present invention can be used to form a semiconductor device using conventional lithography tools and processes. Although the parameters for using the lithography tools are not expected to dramatically change, either the intensity of the light or the exposure time may increase slightly over that of the prior art since there are now more reticle features. However, these changes should be less than 10% in magnitude and can be optimized as needed. The use of the present invention is not expected to be a significant throughput limitation for the lithography tool which would otherwise cause an increase in the production costs of the wafers.

Another benefit of the present invention is that it can achieve a more consistent width of the developed resist features across the substrate surface whether the feature is found in a dense feature pattern, semi-dense feature pattern, or isolated feature pattern. This consistency in the width should still be maintained, even with small variations in the lithographic processing conditions.

The embodiments of the present invention can be used for a number of different types of patterning layers. For example, instead of patterning a conductive layer to make gate electrodes, the present invention could be used to pattern a contact level or an interconnect level of the semiconductor device. Typically, the larger benefit of the present invention is seen when forming masking levels that are considered critical. In other words, those that are designed to have features close to the resolution limit of the lithography tool. Although the present invention can be used for non-critical layers, such as some of the implant masks, the concepts of the present invention can be extended to the implant masks if needed.

Further, the embodiments of the present invention can be integrated to be used with phase shifting masks. In these instances, the phase shifting material can be formed adjacent to the outriggers or attenuating features. Additionally, the outriggers themselves can be composed of phase edges (the edges between phase shifted and non-phase shifted regions on the reticle). These phase shifted outriggers can be made subresolution by having no or substantially less chrome than would a phase shifted feature. In an alternate embodiment, a second lithographic exposure step could be performed of the outrigger feature to ensure that those features do not print in the resist layer.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention. In the claims, means-plus-function clause(s), if any, cover the structures described herein that perform the recited function(s). The mean-plus-function clause(s) also cover structural equivalents and equivalent structures that perform the recited function(s).

We claim:

1. A method of designing a reticle for a semiconductor device comprising the steps of:

defining a first attenuating feature and a second attenuating feature of a reticle layout file, wherein:
the first attenuating feature corresponds to a first device feature within a first region of the semiconductor device;
the second attenuating feature corresponds to a second device feature within the first region; and
the first region includes a first transparent portion and a second transparent portion; and inserting a first outrigger into the reticle layout file for the first region of the semiconductor device, wherein:
the first transparent portion lies between and immediately adjacent to the first attenuating feature and the first outrigger; and
the second transparent portion lies between and immediately adjacent to the second attenuating feature and the first outrigger.

2. The method of claim 1, wherein the first region has a pitch-to-line-width ratio less than 6:1.

3. The method of claim 1, wherein the first region has a pitch-to-line-width ratio less than 3:1.

4. The method of claim 1, wherein the step of defining is performed such that the first attenuating feature includes a phase-shifting region.

5. The method of claim 1, further comprising a step of:
determining dimensions of the first outrigger based on a pitch-to-line-width ratio for the first and second attenuating features.

6. The method of claim 1, wherein the step of inserting the first outrigger inserts a second outrigger, wherein the first outrigger and the second outrigger have different widths.

7. The method of claim 1, wherein the first outrigger is a subresolution feature.

8. A method of designing a reticle for a semiconductor device comprising the steps of:

inserting a first outrigger having a first width into a first region of a reticle layout file, wherein the first region of the reticle layout file corresponds to a first region of the semiconductor device; and inserting a second outrigger having a second width into a second region of the reticle layout file, wherein the second region of the reticle layout file corresponds to a second region of the semiconductor device, and the second width is different from the first width.

9. The method of claim 8, wherein the first region of the semiconductor device has a pitch-to-line-width ratio less than approximately 6:1 and greater than approximately 3:1, and the second region of the semiconductor device has a pitch-to-line width ratio less than approximately 3:1.

10. The method of claim 9, wherein the second outrigger is narrower than the first outrigger.

11. The method of claim 8, further comprising a step of:
defining a first attenuating feature and a second attenuating feature of the reticle layout file, wherein:
the first attenuating feature corresponds to a first device feature within the first region of the semiconductor device;
the second attenuating feature corresponds to a second device feature within the first region of the semiconductor device;
the first region of the semiconductor device includes a first transparent portion and a second transparent portion;
the first transparent portion lies between and immediately adjacent to the first attenuating feature and the first outrigger; and the second transparent portion lies between and immediately adjacent to the second attenuating feature and the first outrigger.

12. The method of claim 11, further comprising a step of:
determining dimensions of the first outrigger based on widths of the first and second attenuating features.

13. A method of forming a semiconductor device comprising the steps of:
forming a layer of resist over a substrate;
exposing the layer of resist using a reticle including a first region having a first attenuating feature, a first transparent portion, a second attenuating feature, a second transparent portion, and a first outrigger, wherein:
the first attenuating feature corresponds to a first device feature within a first region of the semiconductor device;
the second attenuating feature corresponds to a second device feature within the first region;
the first transparent portion lies between and immediately adjacent to the first attenuating feature and the first outrigger; and
the second transparent portion lies between and immediately adjacent to the second attenuating feature and the first outrigger; and
developing the layer after the step of exposing to define device regions for the first region of the semiconductor device.

14. The method of claim 13, wherein:
the step of forming a layer of resist comprises a step of coating the substrate with a positive photoresist; and
the step of exposing is performed such that the first and second attenuating features substantially prevent radiation used during the step of exposing from reaching corresponding regions of the semiconductor device.

15. The method of claim 13, wherein the first region has a pitch-to-line-width ratio less than 6:1.

16. The method of claim 13, wherein the first region has a pitch-to-line-width ratio less than 3:1.

17. The method of claim 13, wherein the step of exposing uses a reticle further having a second outrigger, wherein the first outrigger and the second outrigger have different widths.

18. The method of claim 13, wherein the first outrigger is a subresolution feature.

19. A method of forming a semiconductor device comprising the steps of:
forming a layer of resist over a substrate;
exposing the layer of resist using a reticle having:
a first outrigger in a first region of a reticle layout file, wherein the first region of the reticle layout file corresponds to a first region of the semiconductor device; and
a second outrigger in a second region of the reticle layout file, wherein the second region of the reticle layout file corresponds to a second region of the semiconductor device, wherein:
the first outrigger has first width; and
the second outrigger has a second width that is different from the first width; and
developing the layer after the step of exposing to form device regions.

20. The method of claim 19, wherein the first region of the semiconductor device has a pitch-to-line-width ratio less than approximately 6:1 and greater than approximately 3:1, and the second region of the semiconductor device has a pitch-to-line-width ratio less than approximately 3:1.

21. The method of claim 20, wherein the second outrigger is narrower than the first outrigger.

22. The method of claim 19, wherein:
the first region of the semiconductor device has a first pitch-to-line-width ratio;
the second region of the semiconductor device has a second pitch-to-line-width ratio;
the first outrigger is wider than the second outrigger; and
the first pitch-to-line-width ratio is larger than the second pitch-to-line-width ratio.

23. A method of designing a reticle for a semiconductor device comprising the steps of:
defining a first attenuating feature and a second attenuating feature of a reticle layout file, wherein:
the first attenuating feature is transparent and corresponds to a first device feature within a first region of the semiconductor device;
the second attenuating feature is transparent and corresponds to a second device feature within the first region; and
the first region includes a first opaque portion and a second opaque portion; and
inserting a first outrigger into the reticle layout file for the first region of the semiconductor device, wherein:
the first opaque portion lies between and immediately adjacent to the first attenuating feature and the first outrigger; and
the second opaque portion lies between and immediately adjacent to the second attenuating feature and the first outrigger.

24. The method of claim 23, wherein the first region has a pitch-to-line-width ratio less than 6:1.

25. The method of claim 23, wherein the first region has a pitch-to-line-width ratio less than 3:1.

26. The method of claim 23, wherein the step of defining is performed such that the first attenuating feature includes a phase-shifting region.

27. The method of claim 23, further comprising a step of:
determining dimensions of the first outrigger based on a pitch-to-line-width ratio for the first and second attenuating features.

28. The method of claim 23, wherein the step of inserting a first outrigger inserts a second outrigger, wherein the first outrigger and the second outrigger have different widths.

29. The method of claim 19, wherein the first outrigger is a subresolution feature.

30. A method of forming a semiconductor device comprising the steps of:
forming a layer of resist over a substrate;
exposing the layer of resist using a reticle including a first region having a first attenuating feature, a first opaque portion, a second attenuating feature, a second opaque portion, and a first outrigger, wherein:
the first attenuating feature corresponds to a first device feature within a first region of the semiconductor device;
the second attenuating feature corresponds to a second device feature within the first region;
the first opaque portion lies between and immediately adjacent to the first attenuating feature and the first outrigger; and
the second opaque portion lies between and immediately adjacent to the second attenuating feature and the first outrigger; and
developing the layer after the step of exposing to define device regions for the first region of the semiconductor device.

31. The method of claim 30, wherein:

the step of forming a layer of resist comprises a step of coating the substrate with a negative photoresist; and the step of exposing is performed such that the first and second attenuating features are transparent regions of the reticle.

32. The method of claim 30, wherein the first region has a pitch-to-line-width ratio less than 6:1.

33. The method of claim 30, wherein the first region has a pitch-to-line-width ratio less than 3:1.

34. The method of claim 30, wherein the step of exposing uses a reticle further having a second outrigger, wherein the first outrigger and the second outrigger have different widths.

* * * * *